(12) United States Patent
Desai et al.

(10) Patent No.: US 6,597,611 B2
(45) Date of Patent: Jul. 22, 2003

(54) MEMORY READ CIRCUITRY

(75) Inventors: Shaishav A. Desai, Sunnyvale, CA (US); Devendra N. Tawari, Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/295,953

(22) Filed: Nov. 15, 2002

(65) Prior Publication Data

US 2003/0067823 A1 Apr. 10, 2003

Related U.S. Application Data

(62) Division of application No. 09/908,667, filed on Jul. 17, 2001.

(51) Int. Cl.$^7$ .............................. G11C 7/00; G11C 7/02; G11C 8/00
(52) U.S. Cl. ................. 365/203; 365/189.08; 365/194; 365/214; 365/220; 365/230.05
(58) Field of Search ............................ 365/203, 189.08, 365/194, 214, 220, 230.05

(56) References Cited

U.S. PATENT DOCUMENTS

| | | | |
|---|---|---|---|
| 5,892,725 A | 4/1999 | Lattimore | 365/230.03 |
| 6,058,065 A | 5/2000 | Lattimore | 365/230.03 |
| 6,081,458 A | 6/2000 | Lattimore | 365/189.01 |
| 6,125,051 A | 9/2000 | Kang | 365/145 |
| 6,157,584 A * | 12/2000 | Holst | 365/200 |
| 6,195,280 B1 | 2/2001 | Lattimore | 365/63 |
| 6,215,692 B1 | 4/2001 | Kang | 365/145 |
| 6,240,007 B1 | 5/2001 | Kang | 365/145 |
| 6,373,753 B1 | 4/2002 | Proebsting | 365/189.09 |
| 6,538,932 B2 * | 3/2003 | Ellis et al. | 365/194 |

* cited by examiner

*Primary Examiner*—David Nelms
*Assistant Examiner*—Ly Duy Pham
(74) *Attorney, Agent, or Firm*—Park, Vaughan & Fleming LLP

(57) ABSTRACT

A circuit on a semiconductor for precharging a local bitline and a global bitline. The circuit includes: a precharge input; a first switch, the gate of the first switch coupled to the precharge input, the source of the first switch coupled to a voltage source, the drain of the first switch coupled to the local bitline; a delay element, the input of the delay element coupled to the precharge input; and a second switch, the gate of the second switch coupled to the output of the delay element, the source of the second switch coupled to the voltage source, the drain of the second switch coupled to the global bitline.

15 Claims, 5 Drawing Sheets

MEMORY READ CIRCUITRY

This patent is a division of patent application Ser. No. 09/908,667, filed Jul. 17, 2001.

1. FIELD OF THE INVENTION

The present invention generally relates to data processing systems. More specifically, the present invention relates to memory systems, precharge circuitry and read circuitry.

2. BACKGROUND

As technology advances, memories in semiconductor devices have become larger and more advanced. The number of memory cells on Dynamic Random Access Memories is ever increasing. In addition, modem microprocessors utilize register files that include a large number of registers. Such register files may include multiple read and write access ports. As a result, the register file can be quite large.

A semiconductor memory typically includes a memory cell array that has a grid of bitlines and wordlines, with memory cells located at intersections of the bitlines and the wordlines. During operation, the bitlines and the wordlines are selectively asserted and negated to enable at least one of the memory cells to be read or written.

Increasing demands for larger memories have driven increases in bitlines lengths and loading. The additional lengths of the bitlines and the device count per bitline add wire and diffusion capacitance to an already highly capacitive environment. As a result, additional time is required to charge and discharge this extra capacitance. Such additional time equates to increased read and write times and hence, slower performance.

To decrease the bitline capacitance, prior art memory systems split the bitline into global bitlines and local bitlines. One example of such a memory system is shown in U.S. Pat. No. 6,058,065 to Lattimore.

Figure 1:
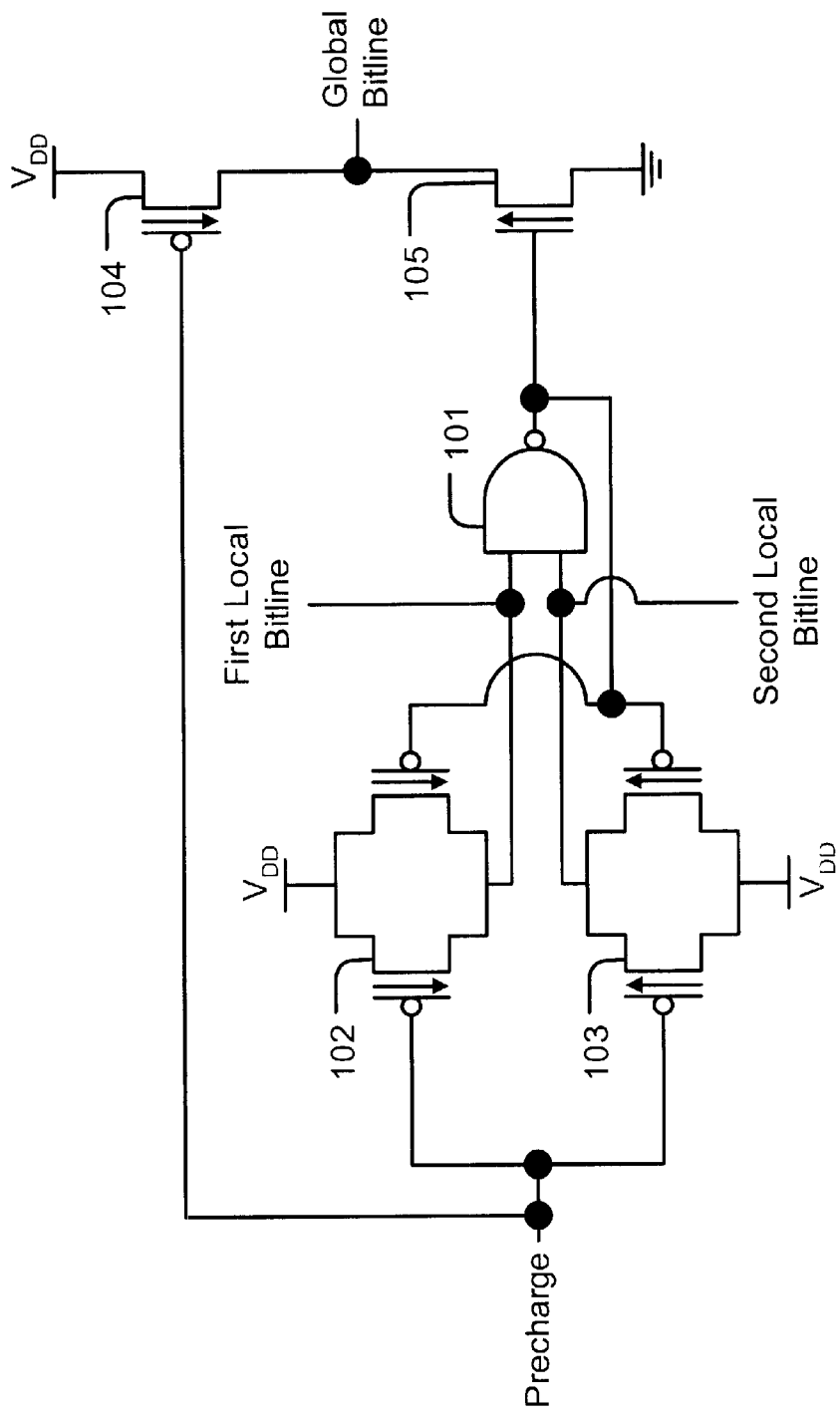

A prior art split bitline read circuit is shown in FIG. 1. The read circuit includes a first local bitline, which would typically be coupled to a first group of memory cells (not shown). The read circuit also includes a second local bitline, which would typically be connected to a second group of memory cells (not shown). The local bitlines are connected to a local sense amp, which, as shown in FIG. 1, is a NAND gate 101.

As is shown in FIG. 1, the first local bitline will be precharged through p-type metal oxide semiconductor (PMOS) transistor 102 when the precharge signal is low. Similarly, the second local bitline will be precharged through PMOS transistor 103 and the global bitline will be precharged high through PMOS transistor 104 when the precharge signal is low. Thus, grounding the precharge signal precharges the first bitline, the second bitline, and the global bitline.

When a memory cell is desired to be read, a local bitline, such as the first local bitline, will be conditionally discharged based upon the content of the memory cell, i.e., the local bitline will be discharged if and only if the memory cell is in a logic low state. As a result, the output of the NAND gate will be conditionally high and the global bitine will be conditionally pulled to ground by the NMOS transistor 105. As a result, the global bitline contains the value read from the memory cell.

Due to differences in physical locations of drivers, different gate and wire loads, and/or variations due to manufacturing processes, voltages and temperatures, it is possible that the timing of the local bitines and the precharge signals can vary. Therefore, under some circumstances, PMOS transistor 104 and NMOS transistor 105 can both be active at the same time and a current, known as a crowbar current, can flow from $V_{DD}$, through PMOS transistor 104 and NMOS transistor 105, to ground. In addition to wasting power and generating heat, this crowbar current can also result in electro-migration related reliability issues.

Figure 2:
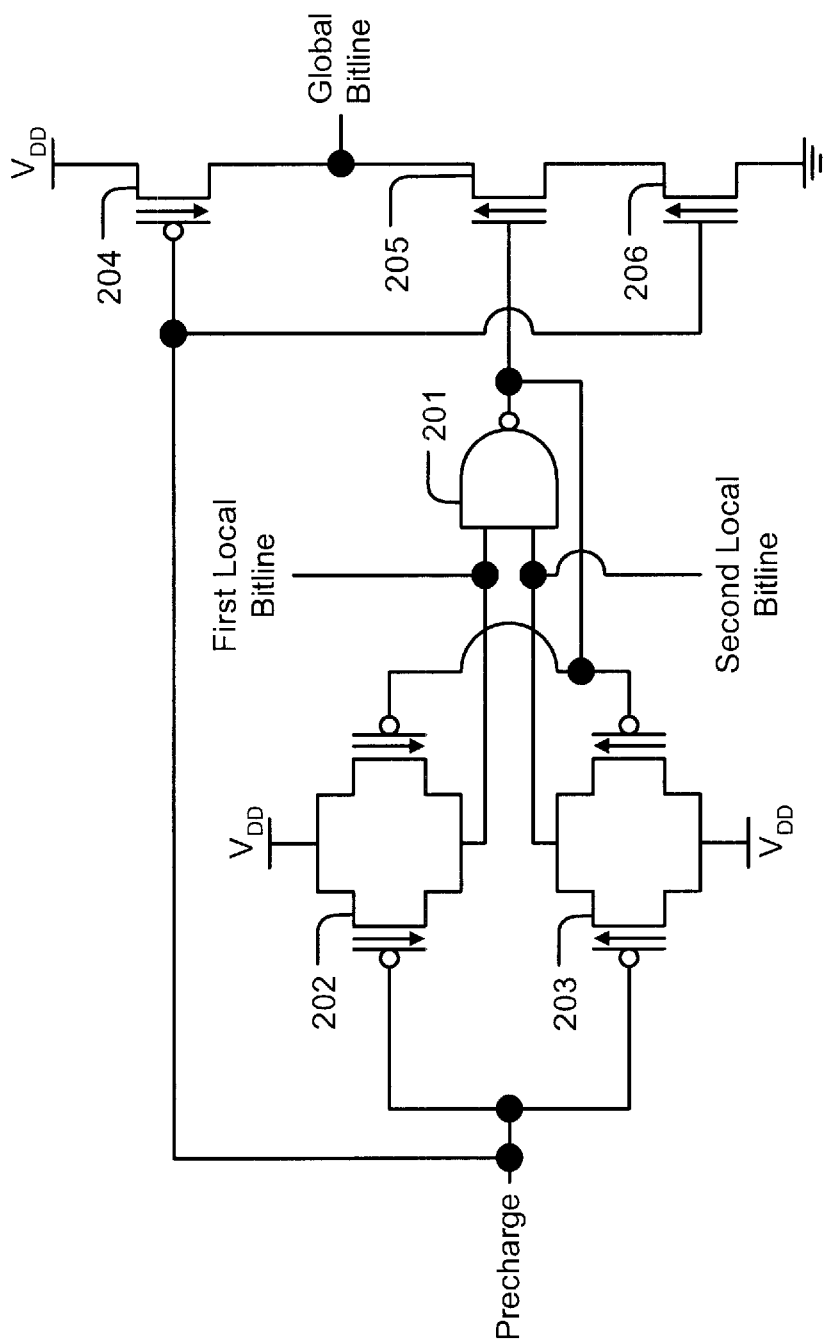

A prior art bitline read circuit that eliminates the above-discussed crowbar current is shown in FIG. 2. This read circuit is similar to the circuit shown in FIG. 1, except that an n-type metal oxide semiconductor (NMOS) transistor is placed in series with NMOS transistor 205. Because PMOS transistor 204 and NMOS transistor 206 are never both activated, the crowbar current is eliminated.

Even though the read circuit shown in FIG. 2 eliminates the crowbar current, the read circuit is not optimal. First, the size of the read circuit shown in FIG. 2 is larger than the read circuit shown in FIG. 1. In order to maintain the same performance, the size of the NMOS transistor 205 and the NAND 201 must be increased. Also, because the NMOS transistor 206 must rapidly pull down the global bitline, which may be highly loaded, its size must be significant. Second, the addition of the NMOS transistor 206 in the read circuit shown in FIG. 2 increases the loading of the precharge line.

Thus, a need exists for an improved read circuit.

3. SUMMARY OF THE INVENTION

One embodiment of the invention is a circuit on a semiconductor for precharging a local bitline and a global bitline. The circuit includes: a precharge input; a first switch, the gate of the first switch coupled to the precharge input, the source of the first switch coupled to a voltage source, the drain of the first switch coupled to the local bitline; a delay element, the input of the delay element coupled to the precharge input; and a second switch, the gate of the second switch coupled to the output of the delay element, the source of the second switch coupled to the voltage source, the drain of the second switch coupled to the global bitline.

Another embodiment of the invention is a read circuit on a semiconductor. The read circuit includes: a precharge input; a first switch, the gate of the first switch coupled to the precharge input, the source of the first switch coupled to a voltage source, the drain of the first switch coupled to a local bitline; a first delay element, the input of the first delay element coupled to the precharge input; a second delay element, the input of the second delay element coupled to the output of the first delay element; a second switch, the gate of the second switch coupled to the output of the second delay element, the source of the second switch coupled to the voltage source, the drain of the second switch coupled to a global bitline; a third switch, the gate of the third switch coupled to the output of the first delay element, the source of the third switch coupled to the voltage source; a fourth switch, the gate of the fourth switch coupled to the output of the first delay element, the source of the fourth switch coupled to ground; a fifth switch, the gate of the fifth switch coupled to the bitline, the source of the fifth switch coupled to the drain of the third switch, the drain of the fifth switch coupled to the drain of the fourth switch; and a sixth switch, the gate of the sixth switch coupled to the drain of the fifth switch, the drain of the sixth switch coupled to the global bitline, the source of the sixth switch coupled to ground.

In still another embodiment, the above read circuit includes: a seventh switch, the gate of the seventh switch coupled to the global bitline, the drain of the seventh switch coupled to the gate of the sixth switch, the source of the seventh switch coupled to ground; and an eighth switch, the gate of the eighth switch coupled to the gate of the sixth switch, the source of the eighth switch coupled to the voltage source, the drain of the eighth switch coupled to the local bitline.

In still another embodiment, the read circuit described in the preceding paragraph includes: a ninth switch, the gate of the ninth switch coupled to the precharge input, the source of the ninth switch coupled to the voltage source, the drain of the ninth switch coupled to the second local bitline; a tenth switch, the gate of the tenth switch coupled to the gate of the sixth switch, the source of the tenth switch coupled to the voltage source, the drain of the tenth switch coupled to the second local bitline; and an eleventh switch, the gate of the eleventh switch coupled to the second local bitline, the source of the eleventh switch coupled to the drain of the third switch, the drain of the eleventh switch is coupled to the gate of the sixth switch.

Still another embodiment of the invention is a computer system. The computer system includes a central processing unit. The central processing unit includes a circuit on a semiconductor for precharging a local bitline and a global bitline. The circuit includes: a precharge input; a first switch, the gate of the first switch coupled to the precharge input, the source of the first switch coupled to a voltage source, the drain of the first switch coupled to the local bitline; a delay element, the input of the delay element coupled to the precharge input; and a second switch, the gate of the second switch coupled to the output of the delay element, the source of the second switch coupled to the voltage source, the drain of the second switch coupled to the global bitline.

Yet still another embodiment of the invention is a Dynamic Random Access Device (DRAM). The DRAM includes a circuit on a semiconductor for precharging a local bitline and a global bitline. The circuit includes: a precharge input; a first switch, the gate of the first switch coupled to the precharge input, the source of the first switch coupled to a voltage source, the drain of the first switch coupled to the local bitline; a delay element, the input of the delay element coupled to the precharge input; and a second switch, the gate of the second switch coupled to the output of the delay element, the source of the second switch coupled to the voltage source, the drain of the second switch coupled to the global bitline.

4. BRIEF DESCRIPTION OF THE FIGURES

FIG. 1 presents a prior art read circuit.

FIG. 2 presents a second prior art read circuit.

Figure 3:
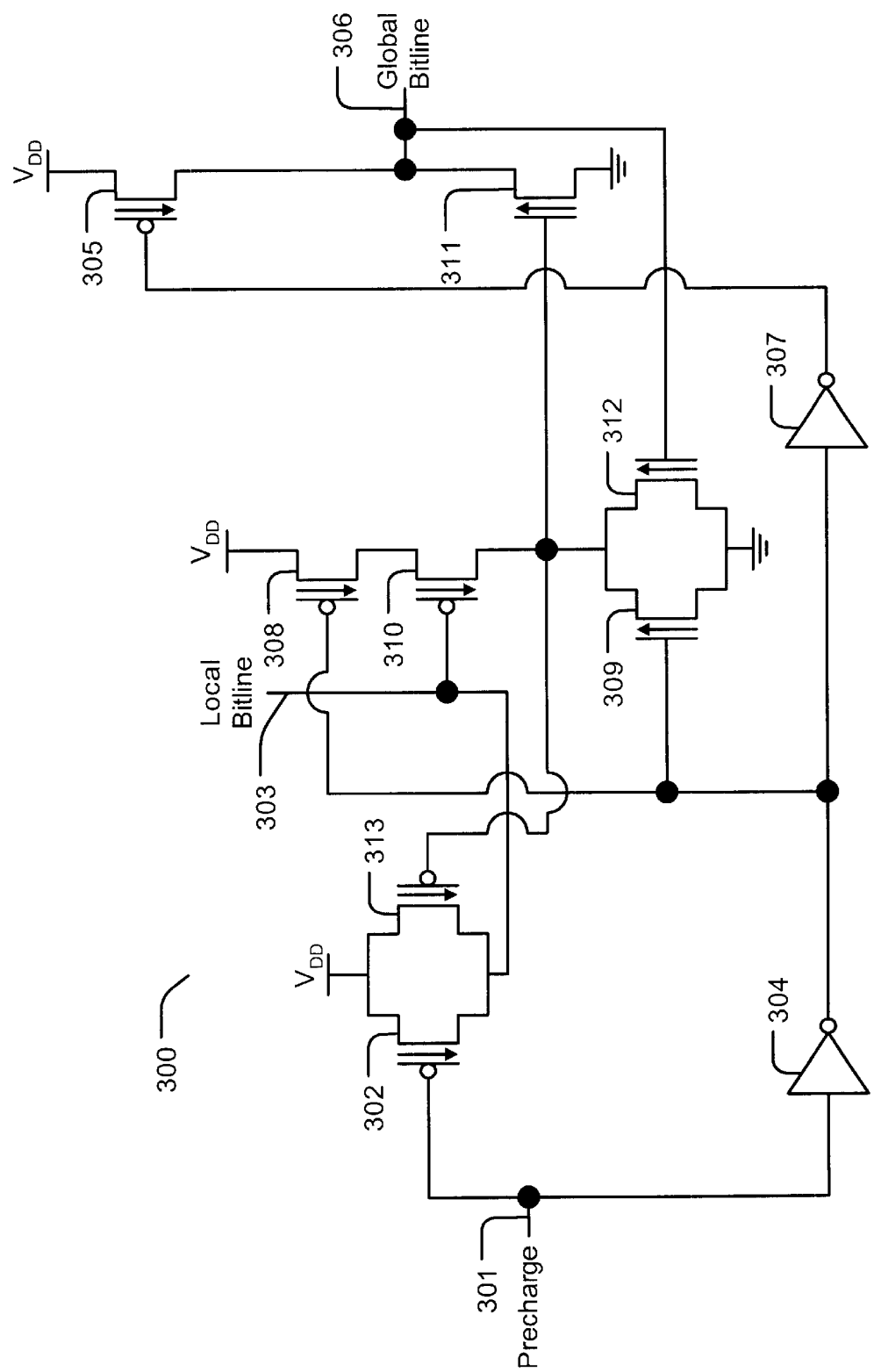

FIG. 3 presents one embodiment of an improved read circuit.

Figure 4:
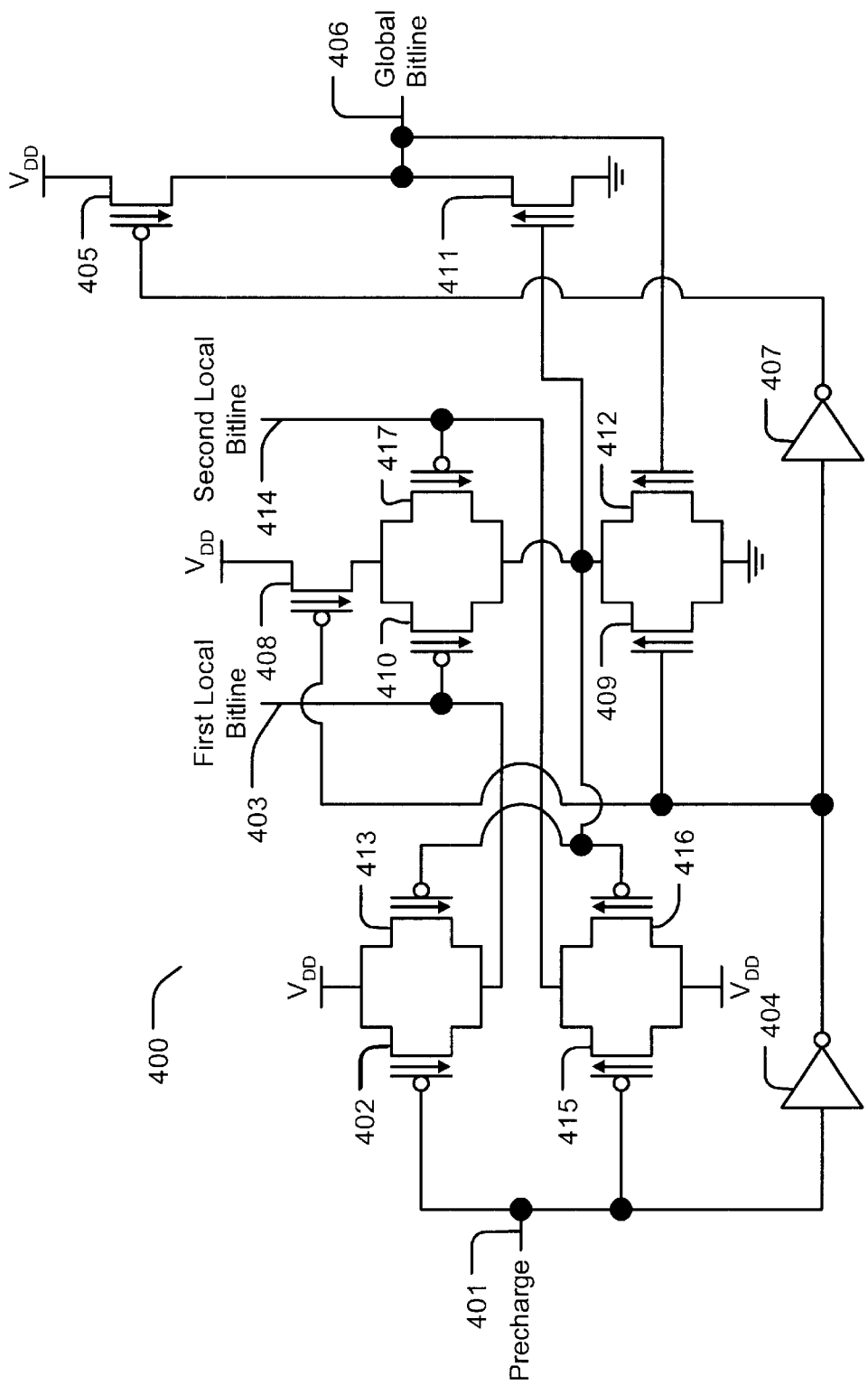

FIG. 4 presents a second embodiment of an improved read circuit.

Figure 5:
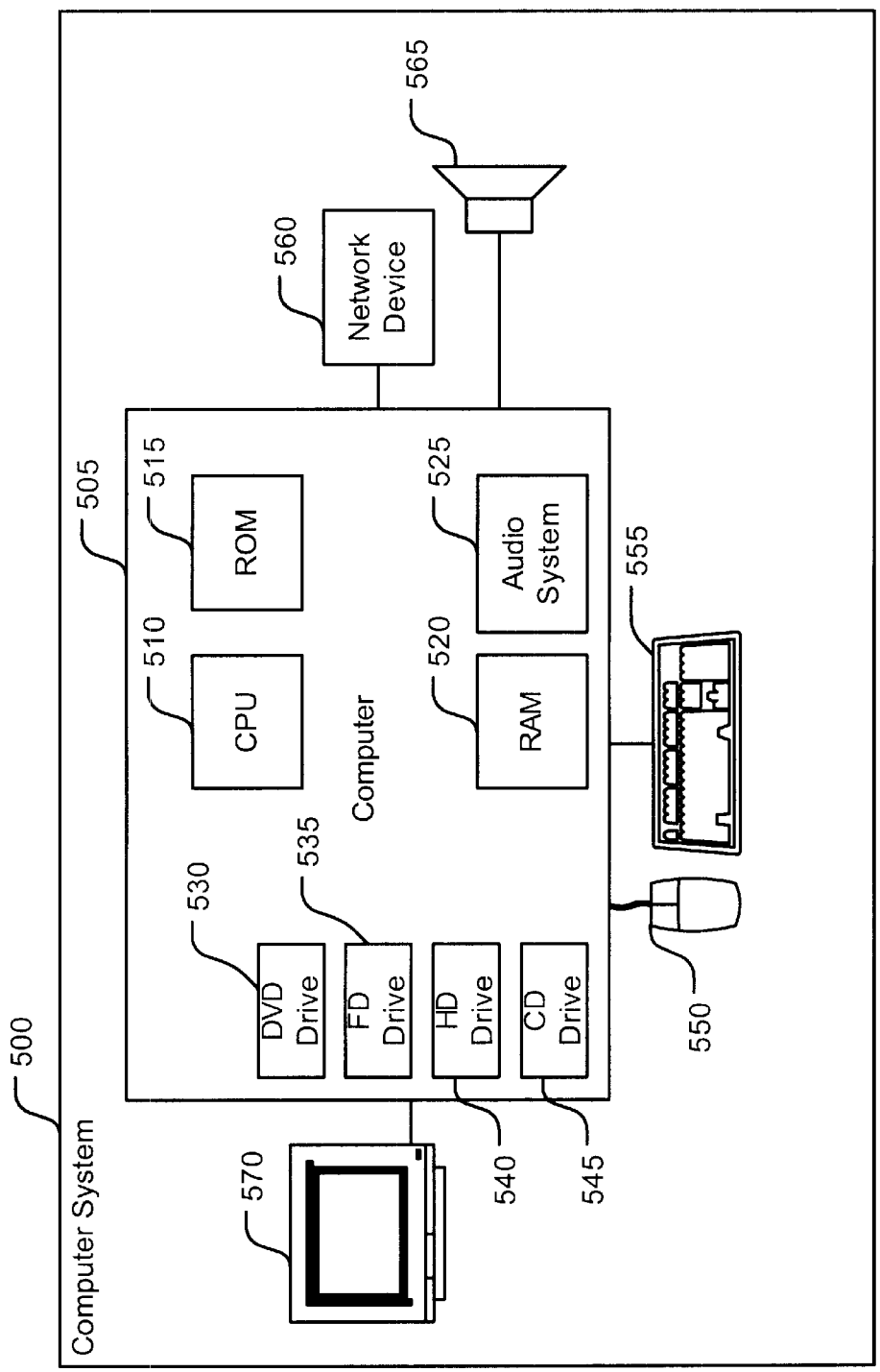

FIG. 5 presents a computer system that includes an improved read circuit.

5. DESCRIPTION OF THE PREFERRED EMBODIMENTS

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

5.1 Improved Read Circuit

FIG. 3 presents an improved read circuit 300. The read circuit 300 includes a precharge input 301. The read circuit 300 also includes a first switch 302. In this embodiment, the first switch is a PMOS transistor. The gate of the first switch is coupled to the precharge input 301. The source of the first switch is coupled to a voltage source, $V_{DD}$. The drain of the first switch 302 is coupled to a local bitline 303.

The read circuit 300 also includes a first delay element 304. In this embodiment, the first delay element 304 is an inverter. The input of the first delay element 304 is coupled to the precharge input 301.

The read circuit 300 also includes a second switch 305. In this embodiment, the second switch 305 is a PMOS transistor. The gate of the second switch 305 is coupled to the output of the first delay element 304. In some embodiments of the invention, the gate of the second switch 305 is directly coupled to the output of the first delay element 304. In other embodiments, as shown in FIG. 3, the gate of the second switch 305 is indirectly coupled to the output of the first delay element 304 by one or more additional components. The source of the second switch 305 is coupled to $V_{DD}$. The drain of the second switch 305 is coupled to a global bitine 306.

Referring again to FIG. 3, the read circuit 300 includes a second delay element 307. In one embodiment of the invention, the second delay element 307 is an inverter. The input of the second delay element 307 is coupled to the output of the first delay element 304. The output of the second delay element 307 is directly coupled to the gate of the second switch 305.

When the precharge input 301 is in a low logic state, the local bitine 303 is precharged through the first switch 302. Similarly, when the precharge input 301 is in a low logic state, the global bitine 306 is precharged through the second switch 305 after a delay created by the first delay element 304 and the second delay element 307.

The read circuit 300 also includes a third switch 308. In one embodiment of the invention, the third switch 308 is a PMOS transistor. The gate of the third switch 308 is coupled to the output of the first delay element 304. The source of the third switch 308 is coupled to $V_{DD}$.

The read circuit 300 also includes a fourth switch 309. In one embodiment of the invention, the fourth switch 309 is an NMOS transistor. The gate of the fourth switch 309 is coupled to the output of the first delay element 304. The source of the fourth switch 309 is coupled to ground.

The read circuit 300 also includes a fifth switch 310. In one embodiment of the invention, the fifth switch 310 is a PMOS transistor. The gate of the fifth switch 310 is coupled to the local bitline 303. The source of the fifth switch 310 is coupled to the drain of the third switch 308. The drain of the fifth switch 310 is coupled to the drain of the fourth switch 309.

The read circuit 300 also includes a sixth switch 311. In one embodiment of the invention, the sixth switch 311 is an NMOS transistor. The gate of the sixth switch 311 is coupled to the drain of the fifth switch 310. The drain of the sixth switch 311 is coupled to the global bitine 306. The source of the sixth switch 311 is coupled to ground.

Referring again to FIG. 3, the read circuit 300 includes a seventh switch 312. In one embodiment of the invention, the seventh switch 312 is an NMOS transistor. The gate of the seventh switch 312 is coupled to the global bitine 306. The drain of the seventh switch is coupled to the gate of the sixth switch. The source of the seventh switch is coupled to ground.

The read circuit 300 also includes an eighth switch 313. In one embodiment the eighth switch 313 is a PMOS transistor. The gate of the eighth switch 313 is coupled to the gate of the sixth switch 311. The source of the eighth switch 313 is coupled to $V_{DD}$. The drain of the eighth switch 313 is coupled to the local bitine 303.

As is evident from FIG. 3, the sixth switch 311 will be ON only when the signal connected to the gate of switch 308 is low. This signal turns OFF switch 305. Therefore, switches 305 and 311 are never ON at the same time. This is true even if the timing between the local bitline 303 and the precharge input 301 is different due to timing mismatches. Thus, the read circuit 300 eliminates the crowbar current without addition of the footer device and resulting overheads.

5.2 Improved Read Circuit with Two Bitline Inputs

Read circuit 300 includes a single local bitline 303. However, other embodiments of the invention include multiple bitines. For example, read circuit 400, as shown in FIG. 4, includes a first local bitine 403 and second local bitline 414.

In addition to the electrical components included in read circuit 300, read circuit 400 includes a ninth switch 415. In one embodiment, the ninth switch 415 is a PMOS transistor. The gate of the ninth switch 415 is coupled to the precharge input 401. The source of the ninth switch 415 is coupled to $V_{DD}$. The drain of the ninth switch 415 is coupled to the second local bitine 415.

Read circuit 400 also includes a tenth switch 416. In one embodiment of the invention, the tenth switch 416 is a PMOS transistor. The gate of the tenth switch 416 is coupled to the gate of the sixth switch 411. The source of the tenth switch 416 is coupled to $V_{DD}$. The drain of the tenth switch 416 is coupled to the second local bitline 414.

Read circuit 400 also includes an eleventh switch 417. In one embodiment of the invention, the eleventh switch 417 is a PMOS transistor. The gate of the eleventh switch 417 is coupled to the second local bitline 414. The source of the eleventh switch 417 is coupled to the drain of the third switch 408. The drain of the eleventh switch 417 is coupled to the gate of the sixth switch 411.

As is evident from FIG. 4, the second switch 405 and the sixth switch 411 can never both pass current at the same time. Thus, just as with read circuit 300, the read circuit 400 also eliminates the crowbar current.

5.3 Computer System Utilizing an Improved Read Circuit

The above-described read circuits 300 and 400 can be utilized in various computer systems. For example, FIG. 5 shows a computer system 500 that includes a computer 505. Computer 505 may include a central processor (CPU) 510, a read only memory (ROM) 515, random access memory (RAM) 520, such as DRAM, SDRAM, RDRAM, or RLDRAM, an audio system 525, a digital versatile disk (DVD) drive 530, a floppy disk drive 535, a hard disk drive 540, and a compact disk (CD) drive 545. In addition, the computer 505 may be coupled to a mouse 550, a keyboard 555, a network device 560, a speaker 565, and a display monitor 570.

The above-described read circuits 300 and 400 may be included in the CPU's register file. In addition the read circuits 300 and 400 may be included in the ROM 515 and/or the RAM 520. Further, the read circuits 300 and 400 may be included in any subsystem that accesses memory such as the network device 560.

5.4 Conclusion

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

It is claimed:

1. A read circuit on a semiconductor comprising:
   a) a precharge input;
   b) a first switch, the gate of the first switch coupled to the precharge input, the source of the firs coupled to a voltage source, the drain of the first switch coupled to a local bitline;
   c) a first delay element, the input of the first delay element coupled to the precharge input;
   d) a second delay element, the input of the second delay element coupled to the output of the first delay element;
   e) a second switch, the gate of the second switch coupled to the output of the second delay element, the source of the second switch coupled to the voltage source, the drain of the second switch coupled to a global bitline;
   f) a third switch, the gate of the third switch coupled to the output of the first delay element, the source of the third switch coupled to the voltage source;
   g) a fourth switch, the gate of the fourth switch coupled to the output of the first delay element, the source of the fourth switch coupled to ground;
   h) a fifth switch, the gate of the fifth switch coupled to the/bitline , the source of the fifth switch coupled to the drain of the third switch, the drain of the fifth switch coupled to the drain of the fourth switch; and
   i) a sixth switch, the gate of the sixth switch coupled to the drain of the fifth switch, the drain of the sixth switch coupled to the global bitline, the source of the sixth switch coupled to ground.

2. The read circuit of claim 1, wherein the first switch is a metal oxide semiconductor transistor.

3. The read circuit of claim 1, wherein the first switch is a p-type metal oxide semiconductor transistor.

4. The read circuit of claim 1, wherein the first delay element is an inverter.

5. The read circuit of claim 1, wherein the second delay element is an inverter.

6. The read circuit of claim 1, wherein the third switch is a type metal oxide semiconductor.

7. The read circuit of claim 1, wherein the fourth switch is an n-type metal oxide semiconductor.

8. The read circuit of claim 1, wherein the fifth switch is a p-type metal oxide semiconductor.

9. The read circuit of claim 1, wherein the sixth switch is an n-type metal oxide semiconductor.

10. The read circuit of claim 1, further comprising:
    j) a seventh switch, the gate of the seventh switch coupled to the global bitline, the drain of the seventh switch coupled to the gate of the sixth switch, the source of the seventh switch coupled to ground; and k) an eighth switch, the gate of the eighth switch coupled to the gate of the sixth switch, the source of the eighth switch coupled to the voltage source, the drain of the eighth switch coupled to the first local bitline.

11. The read circuit of claim 10, wherein the seventh switch is an n-type metal oxide semiconductor.

12. The read circuit of claim 10, wherein the eighth switch is a p-type metal oxide semiconductor.

13. The read circuit of claim 10, further comprising:

l) a ninth switch, the gate of the ninth switch coupled to the precharge input, the source of the ninth switch coupled to the voltage source, the drain of the ninth switch coupled to the second local bitline;

m) a tenth switch, the gate of the tenth switch coupled to the gate of the sixth switch, the source of the tenth switch coupled to the voltage source, the drain of the tenth switch coupled to the second local bitline; and n) an eleventh switch, the gate of the eleventh switch coupled to the second local bitline, the source of the eleventh switch coupled to the drain of the third switch, the drain of the eleventh switch is coupled to the gate of the sixth switch.

14. A computer system containing a central processing unit, the central processing unit containing a read circuit including:

a) a precharge input;

b) a first switch, the gate of the first switch coupled to the precharge input, the source of the first switch coupled to a voltage source, the drain of the first switch coupled to a local bitline;

c) a first delay element, the input of the first delay element coupled to the precharge input;

d) a second delay element, the input of the second delay element coupled to the output of the first delay element;

e) a second switch, the gate of the second switch coupled to the output of the second delay element, the source of the second switch coupled to the voltage source, the drain of the second switch coupled to a global bitline;

f) a third switch, the gate of the third switch coupled to the output of the first delay element, the source of the third switch coupled to the voltage source;

g) a fourth switch, the gate of the fourth switch coupled to the output of the first delay element, the source of the fourth switch coupled to ground;

h) a fifth switch, the gate of the fifth switch coupled to the(bitline, the source of the fifth switch coupled to the drain of the third switch, the drain of the fifth switch coupled to the drain of the fourth switch; and i) a sixth switch, the gate of the sixth switch coupled to the drain of the fifth switch, the drain of the sixth switch coupled to the global bitline, the source of the sixth switch coupled to ground.

15. A Dynamic Random Access Memory (DRAM) containing a read circuit including:

a) a precharge input;

b) a first switch, the gate of the first switch coupled to the precharge input, the source of the first switch coupled to a voltage source, the drain of the first switch coupled to a local bitline;

c) a first delay element, the input of the first delay element coupled to the precharge input;

d) a second delay element, the input of the second delay element coupled to the output of the first delay element;

e) a second switch, the gate of the second switch coupled to the output of the second delay element, the source of the second switch coupled to the voltage source, the drain of the second switch coupled to a global bitline;

f) a third switch, the gate of the third switch coupled to the output of the first delay element, the source of the third switch coupled to the voltage source;

g) a fourth switch, the gate of the fourth switch coupled to the output of the first delay element, the source of the fourth switch coupled to ground;

h) a fifth switch, the gate of the fifth switch coupled to the local bitline, the source of the fifth switch coupled to the drain of the third switch, the drain of the fifth switch coupled to the drain of the fourth switch; and i) a sixth switch, the gate of the sixth switch coupled to the drain of the fifth switch, the drain of the sixth switch coupled to the global bitline, the source of the sixth switch coupled to ground.

* * * * *